United States Patent
Taylor, Jr.

(10) Patent No.: US 7,544,595 B2
(45) Date of Patent: Jun. 9, 2009

(54) FORMING A SEMICONDUCTOR DEVICE HAVING A METAL ELECTRODE AND STRUCTURE THEREOF

(75) Inventor: William J. Taylor, Jr., Round Rock, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 99 days.

(21) Appl. No.: 11/619,861

(22) Filed: Jan. 4, 2007

(65) Prior Publication Data

US 2008/0164498 A1 Jul. 10, 2008

(51) Int. Cl.
*H01L 21/3205* (2006.01)

(52) U.S. Cl. .................. 438/585; 438/199; 438/287; 438/289; 438/592; 438/595; 257/E21.444

(58) Field of Classification Search .............. None
See application file for complete search history.

(56) References Cited

U.S. PATENT DOCUMENTS 5,168,072 A * 12/1992 Moslehi ................ 438/300
5,663,578 A * 9/1997 Hsu et al. ............... 257/66

FOREIGN PATENT DOCUMENTS

WO 2005024899 A2 3/2005

* cited by examiner

*Primary Examiner*—Fernando L. Toledo
*Assistant Examiner*—Kyoung Lee
(74) *Attorney, Agent, or Firm*—Kim-Marie Vo; Joanna G. Chiu

(57) ABSTRACT

A method for forming a semiconductor device includes forming a gate dielectric over a substrate, forming a metal electrode over the gate dielectric, forming a first sacrificial layer which includes polysilicon or a metal over the metal electrode, removing the first sacrificial layer, and forming a gate electrode contact over and coupled to the metal electrode.

18 Claims, 3 Drawing Sheets

FORMING A SEMICONDUCTOR DEVICE HAVING A METAL ELECTRODE AND STRUCTURE THEREOF

BACKGROUND

1. Field

This disclosure relates generally to semiconductor devices, and more specifically, to semiconductor devices having a metal electrode.

2. Related Art

Parasitic gate capacitance between a gate electrode and a contact undesirably decreases the speed of the device. The parasitic gate capacitance can be reduced by reducing the thickness of the gate electrode. A common gate electrode includes polysilicon and a silicide formed over the polysilicon. If the polysilicon is reduced in thickness too much the polysilicon will be consumed during the silicidation process. This undesirably results in the gate electrode being silicide only. Thus, the silicide will be in contact with the underlying gate dielectric resulting in an undesirable threshold voltage. Therefore, a need exists for a process that decreases parasitic gate capacitance between a gate electrode and a contact without a silicide being in contact with the underlying gate dielectric.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one embodiment, a second sacrificial layer (e.g., a nitride layer) is formed over a first sacrificial layer (e.g., a polysilicon layer), which is formed over a metal electrode. The second sacrificial layer can protect the polysilicon layer during patterning and silicidation and the first sacrificial layer can protect the underlying metal electrode during implantation of source/drain regions. The second sacrificial layer and the first sacrificial layer are removed, in one embodiment, before forming an interlevel dielectric layer and contacts. During contact formation, a contact may be formed directly to the electrode as opposed to a silicide formed over a gate electrode. In one embodiment, only the first sacrificial layer is formed. The sacrificial layers can also be referred to as dummy layers. As a skilled artisan can appreciate, the gate stack need not include a silicide in this embodiment. In addition, the first sacrificial layer (which can be polysilicon) is removed during subsequent processing, unlike typical metal gate processing where polysilicon remains in the final device. In addition, in one embodiment, the spacers are formed when the first sacrificial layer and second sacrificial layer, if present, are present resulting in the spacers having a height that is greater than that of the metal electrode, unlike the typical metal gate process flows, in which the spacer height is comparable to the combined electrode height of the electrode, which may include a metal layer, a polysilicon layer, and a silicide layer.

Figure 1:
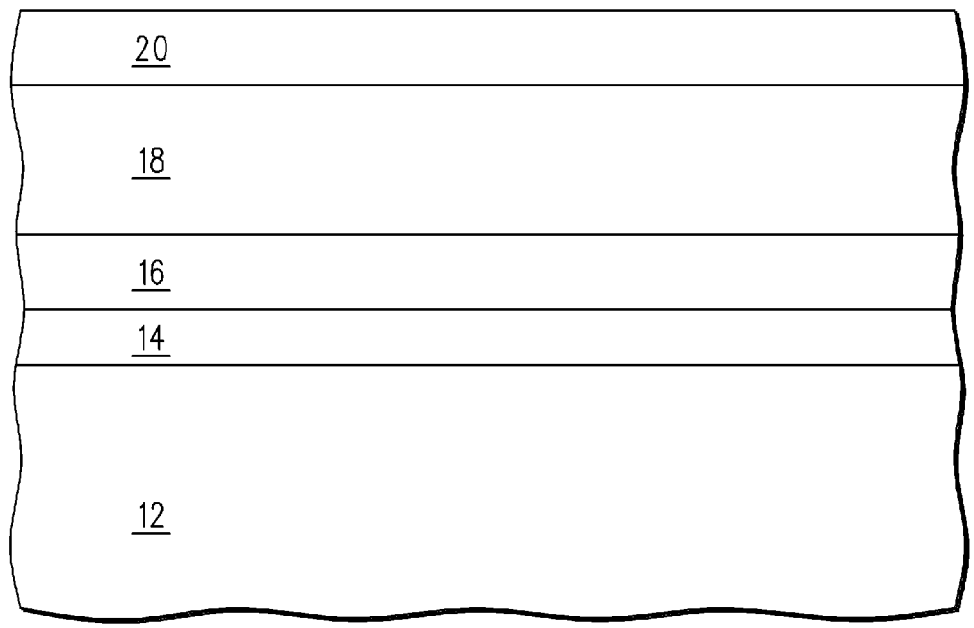
FIG. 1 illustrates a cross-section of a semiconductor device including a semiconductor substrate, a gate dielectric, a metal electrode, a first sacrificial layer, and a second sacrificial layer in accordance with an embodiment.

FIG. 1 illustrates a cross-section of a semiconductor device 10 including a semiconductor substrate 12, a gate dielectric 14, a metal electrode 16, a first sacrificial layer 18, and a second sacrificial layer 20 in accordance with an embodiment. The semiconductor substrate 12 described herein can be any semiconductor material or combinations of materials, such as gallium arsenide, silicon germanium, silicon-on-insulator (SOI), silicon, monocrystalline silicon, the like, and combinations of the above. The gate dielectric 14 is formed over the semiconductor substrate 12 and may be any suitable dielectric, such a silicon dioxide or a dielectric having a high dielectric constant, such as a (insulating) metal oxide (e.g., hafnium oxide), the like, or combinations of the above. (A material with a high dielectric constant has a dielectric constant greater than that of silicon dioxide.) In one embodiment, the gate dielectric layer is approximately 5 to approximately 50 Angstroms thick and in one embodiment is approximately 20 Angstroms thick. The metal electrode 16 is formed over the gate dielectric 14 and, in one embodiment is in contact with the gate dielectric 14. The metal electrode 16 may be any conductive material that includes a metal, such as a conductive metal oxide, an alloy, or a material including a metal. In one embodiment, the metal electrode 16 is tantalum carbide, which is minimally etched, if at all, when exposed to phosphoric acid. As will be understood after further discussion, it may be desirable for the metal electrode 16 to be resistant to phosphoric acid, as this chemistry may be used to remove the first or second sacrificial layers 18 and 20. In one embodiment, the metal electrode 16 is approximately 20 to approximately 200 Angstroms thick or more specifically, approximately 100 Angstroms thick.

The first sacrificial layer 18 is formed over the metal electrode 16 and in one embodiment is formed in contact with the metal electrode 16. The first sacrificial layer 18 may be a silicon-containing layer (e.g., polysilicon) or a metal layer (e.g., a metal, metal alloy, a conductive metal oxide, the like, or combinations of the above). In one embodiment, the first sacrificial layer 18 is approximately 400 to approximately 1000 Angstroms thick or more specifically approximately 600 to approximately 800 Angstroms. In another embodiment, the first sacrificial layer 18 comprises a metal and the first sacrificial layer 18 is a material that etches selective to the metal electrode 16. In one embodiment, the metal electrode 16 is tantalum carbide and the first sacrificial layer 18 is titanium nitride. In one embodiment, the second sacrificial layer 20 is formed over the first sacrificial layer 18. In one embodiment, the second sacrificial layer 20 is in contact with the first sacrificial layer 18. The second sacrificial layer 20 may be a nitride (e.g., silicon nitride) or a metal (e.g., metal, metal alloy, conductive metal oxide, the like, or combinations of the above). In one embodiment, the first sacrificial layer 18 is polysilicon and the second sacrificial layer 20 is a nitride or a metal and as will be better understood after further discussion, the second sacrificial layer 20 may protect the first sacrificial layer 18 (if the first sacrificial layer 18 includes silicon) from having a silicide formed over the first sacrificial layer 18. However, if the first sacrificial layer 18 does not include silicon, the second sacrificial layer 20 may not be used, as the first sacrificial layer 18 will not have a silicide formed over it regardless as to the presence of the second sacrificial layer 20. Hence, in one embodiment, the first sacrificial layer 18 is a metal that is different from the metal electrode 16 and the second sacrificial layer 20 is not formed. In another embodiment, the first sacrificial layer 18 is a metal that is different from the metal electrode 16 and the second sacrificial layer 20 is formed. In one embodiment, the second sacrificial layer 20 may be approximately 50 to approximately 400 Angstroms or more specifically approximately 200 Angstroms thick. The gate dielectric 14, the metal electrode 16, the first sacrificial layer 18, and the second sacrificial layer 20, if present, can be formed by any suitable process such as chemical vapor deposition (CVD), physical vapor deposition (PVD), the like, and combinations of the above.

Figure 2:
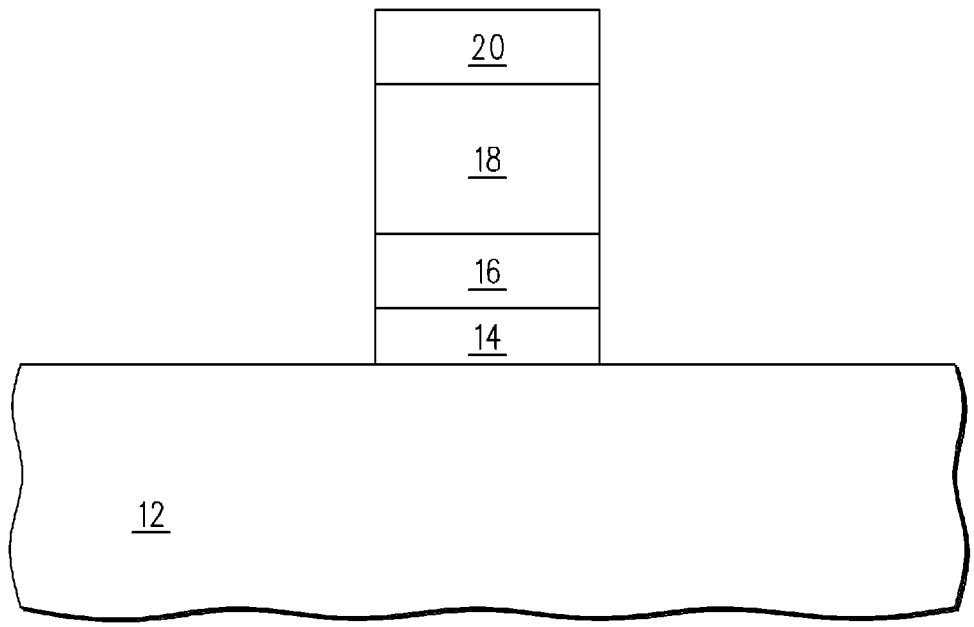
FIG. 2 illustrates the cross-section of FIG. 1 after patterning the gate dielectric, the metal electrode, the first sacrificial layer, and the second sacrificial layer in accordance with an embodiment.

FIG. 2 illustrates the cross-section of FIG. 1 after patterning the gate dielectric 14, the metal electrode 16, the first sacrificial layer 18, and the second sacrificial layer 20, if present, in accordance with an embodiment. Any suitable patterning process can be used. Any of the gate dielectric 14, the metal electrode 16, the first sacrificial layer 18, and the second sacrificial layer 20, if present, may be patterned simultaneously or sequentially. In one embodiment, a plasma etch using conventional chemistries (and a mask comprising, for example, photoresist) is used to remove each of the gate dielectric 14, the metal electrode 16, the first sacrificial layer 18, and the second sacrificial layer 20, if present. The removal of each of the gate dielectric 14, the metal electrode 16, the first sacrificial layer 18, and the second sacrificial layer 20, if present, may occur in different chambers or the same chamber of an etch tool. After patterning the gate dielectric 14, the metal electrode 16, the first sacrificial layer 18, and the second sacrificial layer 20, if present, result in a stack.

Figure 3:
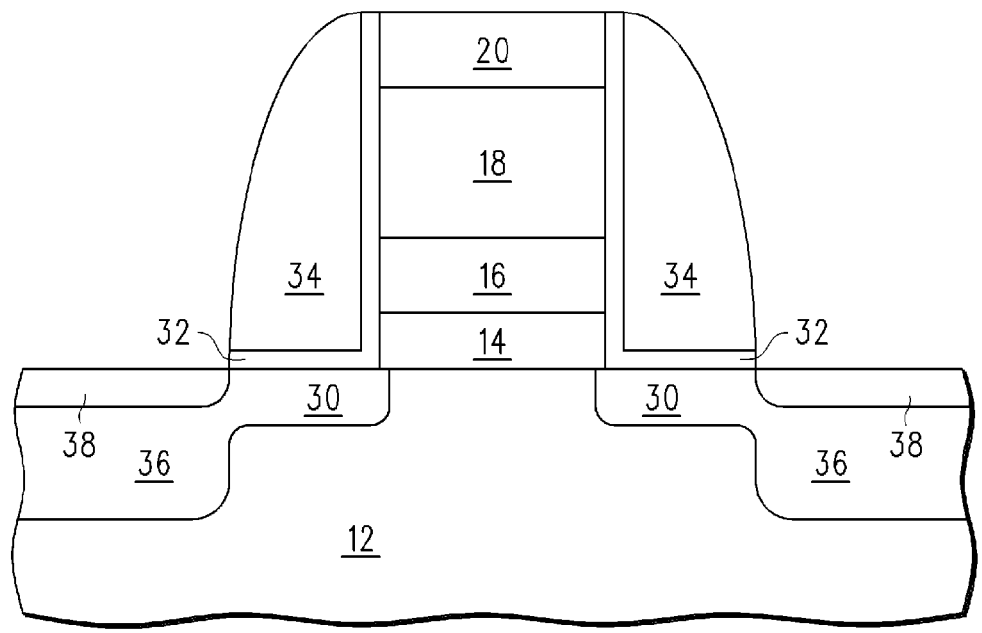
FIG. 3 illustrates the cross-section of FIG. 2 after forming spacers and source/drain regions in accordance with an embodiment.

FIG. 3 illustrates the cross-section of FIG. 2 after forming spacers and source/drain regions in accordance with an embodiment. First, source/drain extensions 30 may be formed within the semiconductor substrate 12 as known in the art. Afterwards, liners 32 may be formed as known in the art. The liners 32 may be an oxide, such as silicon dioxide. After forming the liners 32, the spacers 34 may be formed. The spacers 34 are adjacent the metal electrode 16 (and the gate oxide 14, the first sacrificial layer 18, and the second sacrificial layer 20, if present). In one embodiment, the spacers 34 are dielectric materials, such a nitride (e.g., silicon nitride). A skilled artisan recognizes that although spacers 34 appear in cross-section as two different spacers, in three dimensions the spacers 34 are actually one spacer that wraps around the stack of the gate dielectric 14, the metal electrode 16, the first sacrificial layer 18, and the second sacrificial layer 20, if present. After forming spacers 34, the rest of the source/drain regions are formed. Deep source/drains 36 are formed as known in the art. Hence, source/drain regions are formed in the substrate adjacent and underlying at least a portion of the gate dielectric. Afterwards, a conventional silicidation process may be performed to form silicide 38 over the deep/source drains 36. Silicide 38 is only formed over exposed regions that include silicon. Hence, if deep source/drains 36 do not include silicon then the silicide 38 will not be formed in these regions. Furthermore, if the second sacrificial layer 20, if present, or the first sacrificial layer 18 (if the second sacrificial layer 20 is not present) do not include silicon, then silicide is not formed over the first or second sacrificial layers 18 or 20.

Figure 4:
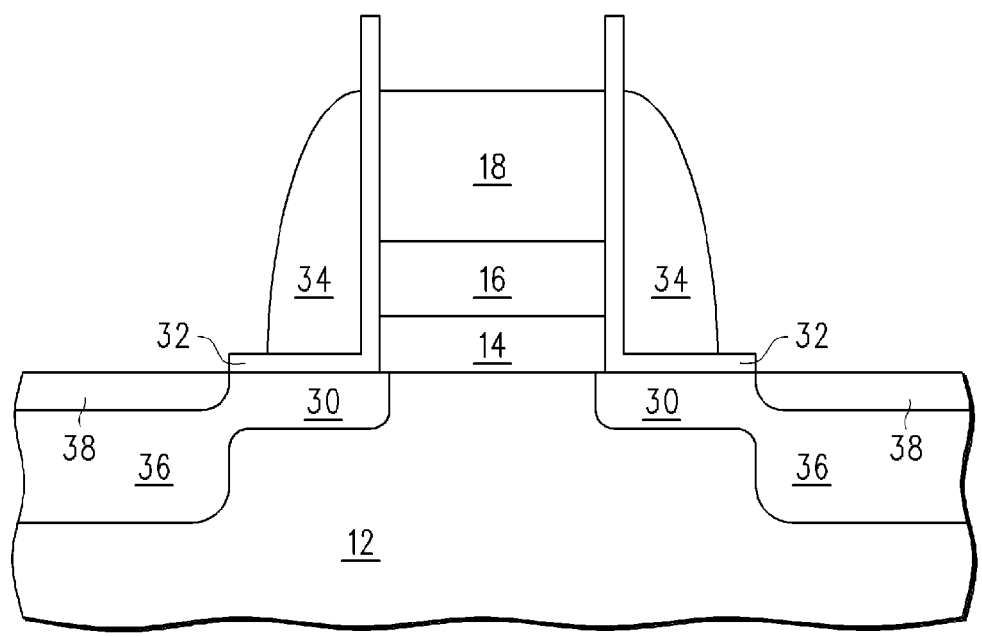
FIG. 4 illustrates the cross-section of FIG. 3 after removing the second sacrificial layer in accordance with an embodiment.

FIG. 4 illustrates the cross-section of FIG. 3 after removing the second sacrificial layer 20, if previously present, in accordance with an embodiment. The second sacrificial layer 20 may be removed using any suitable process. In one embodiment, if the second sacrificial layer 20 is a nitride (e.g., approximately 100 Angstroms of nitride), phosphoric acid can be used to remove the second sacrificial layer 20. In this embodiment, when removing the second sacrificial layer 20, if the spacers 34 are also a nitride (i.e., the same material as the second sacrificial layer 20) the spacers 34 are reduced in height an amount substantially equal to the amount of the second sacrificial layer 20 that is removed. (The reduction of height of the spacers 34 may not be equal to the amount of the second sacrificial layer that is removed due to processing margin and hence, the reduction of height may only be substantially equal to the amount of the second sacrificial layer that is removed.) In addition, the spacers 34 will be etched in the horizontal direction (in width), as illustrated in FIG. 4. If the liner 32 is an oxide, then the liner 32 will not be reduced in height in this embodiment.

Figure 5:
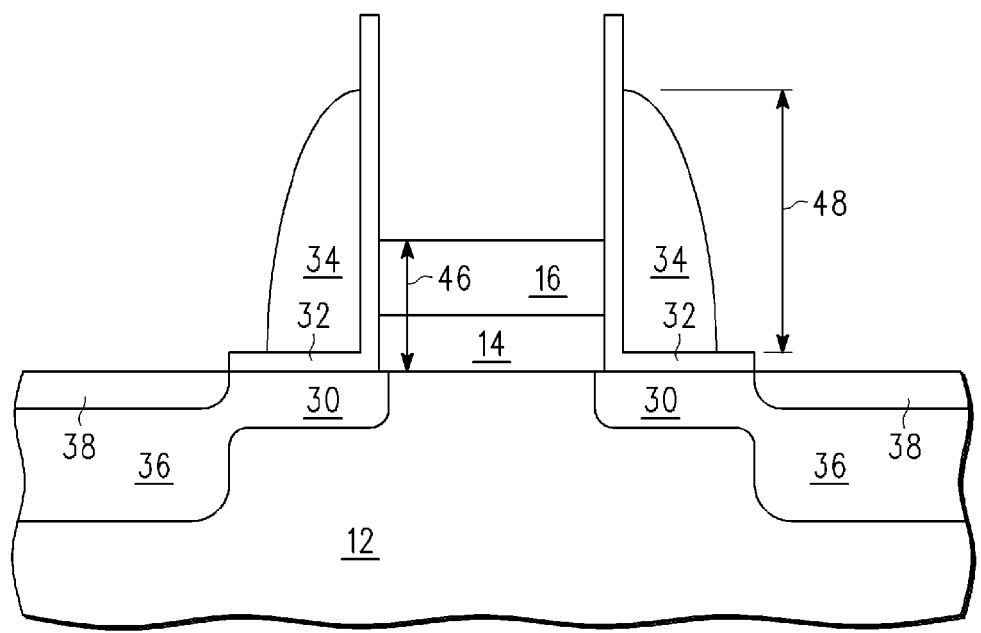
FIG. 5 illustrates the cross-section of FIG. 4 after removing the first sacrificial layer in accordance with an embodiment.

FIG. 5 illustrates the cross-section of FIG. 4 after removing the first sacrificial layer 18 in accordance with an embodiment. The first sacrificial layer 18 may be removed using any suitable process. In one embodiment, a wet or dry etch removal is used. For example, a dry etch can be used if the first sacrificial layer 18 is polysilicon. In one embodiment, the process used to remove to the first sacrificial layer 18 selectively removes the first sacrificial layer 18 with respect to the underlying metal electrode 16. In other words, the process used to remove the first sacrificial layer 18 does not substantially remove the metal electrode 16. (It is possible that some of the metal electrode 16 may be removed during the removal of the first sacrificial layer 18 due to processing margin, but this amount should not be significant as to affect the electrical properties of the transistor being formed.) In another embodiment, if the process used to remove the first sacrificial layer 18 is not selective to the underlying metal electrode 16 then the thickness of the metal electrode 16 should be chosen so that after removing the first sacrificial layer 18, the desired thickness of the metal electrode 16 is achieved. In one embodiment, the desired thickness of the metal electrode 16 is approximately 20 to approximately 200 Angstroms. In addition, the liners 32 and the spacers 34 may not be removed.

After removing the first sacrificial layer 18, the height of the stack, which is the combined height of the gate dielectric 14 and the metal electrode 16, has a combined height 46 and the spacers 34 have a height 48. In one embodiment, the ratio of the (spacer) height 48 to the combined height 46 (of the gate dielectric 14 and the metal electrode 16) is between at least (approximately) 2:1 and at least (approximately) 10:1. In one embodiment, the ratio of the height 48 to the combined height 46 is at least (approximately) 3:1.

Figure 6:
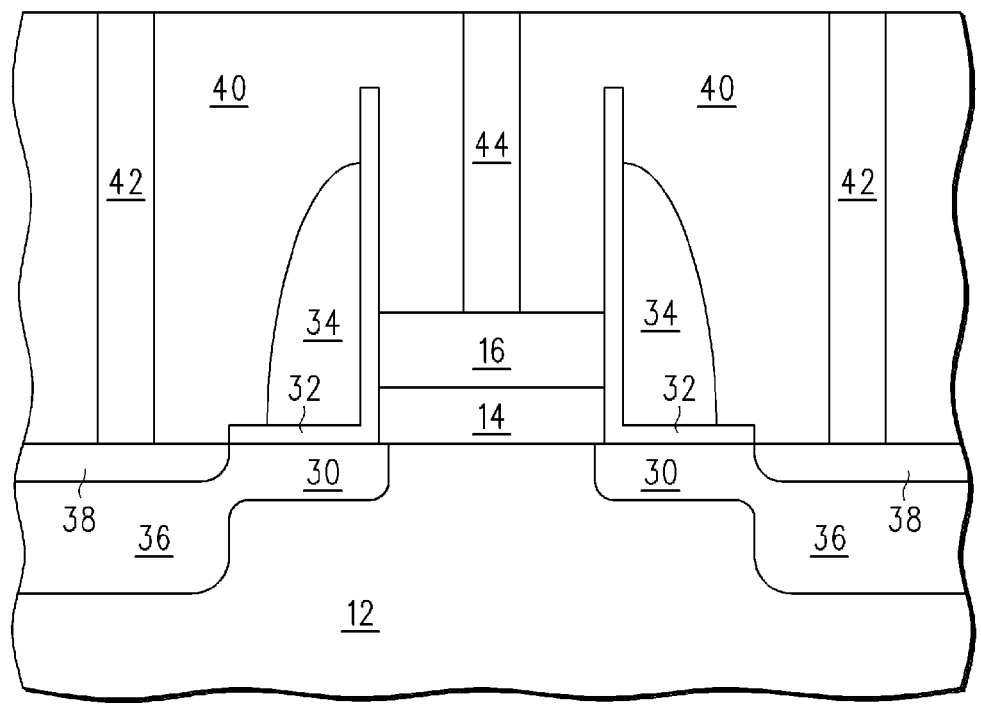
FIG. 6 illustrates the cross-section of FIG. 5 after forming a dielectric layer and contacts in accordance with an embodiment.

FIG. 6 illustrates the cross-section of FIG. 5 after forming a dielectric layer 40 and contacts in accordance with an embodiment. The dielectric layer 40 is formed over the semiconductor substrate 12 (and hence, the structures formed on and within the semiconductor substrate 12). The dielectric layer 40 may be any suitable dielectric used for interlevel dielectric layers. In one embodiment, the dielectric layer 40 is a dielectric material having a low dielectric constant (i.e., a material with a dielectric constant less than that of silicon dioxide). In another embodiment, the dielectric layer 40 is silicon dioxide. The dielectric layer 40 may be formed by any suitable process, such as CVD, PVD, the like, or combinations of the above. After forming the dielectric layer 40, the dielectric layer 40 is patterned as known in the art to forming contact openings (not shown). The contact openings are then filled with a conductive material, such as copper or tungsten (and possibly other conductive layers, such as conductive liners), to form source/drain contacts 42 and a gate electrode contact 44. Any suitable known processing can be used to form the source/drain contacts 42 and the gate electrode contact 44. The source/drain contacts 42 are coupled to and formed over the source/drain regions. The gate electrode contact 44 is coupled to and over the metal electrode 16. In the embodiment illustrated, the gate electrode contact 44 is in direct contact with the metal electrode 16. In other embodiments, an intervening layer may be present between the gate electrode contact 44 and the metal electrode 16.

By now it should be appreciated that there has been provided a need exists for a process that decreases parasitic gate capacitance between a gate electrode and a contact without a silicide being in contact with the underlying gate dielectric. Furthermore, a skilled artisan should recognize that as used the gate electrode may have 1 or more layers to which a contact is coupled. In one embodiment, a metal gate electrode is the entire gate electrode (i.e., the gate electrode includes only the metal gate electrode).

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. The term "coupled," as used herein, is not intended to be limited to a direct coupling or a mechanical coupling. Unless stated otherwise, terms such as "first" and "second" are used to distinguish arbitrarily between the elements such terms describe. Thus, these terms are not necessarily intended to indicate temporal or other prioritization of such elements.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

What is claimed is:

1. A method for forming a semiconductor device comprising:
   forming a gate dielectric over a substrate;
   forming a metal electrode over the gate dielectric;
   forming a first sacrificial layer over the metal electrode, wherein the first sacrificial layer comprises a material selected from a group consisting of polysilicon and a metal;
   removing the first sacrificial layer; and
   forming a gate electrode contact over and coupled to the metal electrode.

2. The method of claim 1, further comprising:
   forming a spacer adjacent the metal electrode and the first sacrificial layer, wherein forming the spacer is performed prior to removing the first sacrificial layer.

3. The method of claim 1, wherein forming the first sacrificial layer comprises forming the first sacrificial layer comprising polysilicon.

4. The method of claim 1, wherein forming the first sacrificial layer comprises forming the first sacrificial layer comprising a first metal.

5. The method of claim 4, wherein forming the first sacrificial layer comprising the first metal comprises:
   forming the first sacrificial layer comprising the first metal, wherein the first sacrificial layer is capable of being removed selective to the metal electrode.

6. The method of claim 4, wherein forming the metal electrode comprises forming the metal electrode comprising a second metal, different from the first metal.

7. The method of claim 1, wherein forming the metal electrode comprises forming the metal electrode having a thickness in a range of approximately 20 to approximately 200 Angstroms, and forming the first sacrificial layer comprises forming the first sacrificial layer having a thickness in a range of approximately 400 to approximately 1000 Angstroms.

8. The method of claim 1, further comprising:
   forming a second sacrificial layer over the first sacrificial layer; and
   removing the second sacrificial layer prior to forming the gate electrode contact.

9. The method of claim 8, wherein forming the second sacrificial layer comprises forming the second sacrificial layer comprising nitride.

10. The method of claim 8, wherein forming the second sacrificial layer comprises forming the second sacrificial layer comprising a metal.

11. A method for forming a semiconductor device comprising:
    forming a gate dielectric over a substrate;
    forming a metal electrode over the gate dielectric;
    forming a first sacrificial layer over the metal electrode, the first sacrificial layer comprising polysilicon;
    forming a second sacrificial layer over the first sacrificial layer;
    forming a spacer adjacent the metal electrode, the first sacrificial layer, and the second sacrificial layer;
    removing the second sacrificial layer;
    removing the first sacrificial layer; and
    forming a gate electrode contact over and coupled to the metal electrode.

12. The method of claim 11, wherein forming the second sacrificial layer comprises forming the second sacrificial layer comprising nitride.

13. The method of claim 11, wherein forming the second sacrificial layer comprises forming the second sacrificial layer comprising a metal.

14. The method of claim 11, wherein forming the spacer comprises forming the spacer having a height that is at least twice a combined height of the metal electrode and the gate dielectric.

15. The method of claim 11, wherein forming the metal electrode comprises forming the metal electrode having a thickness in a range of approximately 20 to approximately 200 Angstroms.

16. The method of claim 11, wherein forming the first sacrificial layer comprises forming the first sacrificial layer having a thickness in a range of approximately 400 to approximately 1000 Angstroms.

17. The method of claim 11, wherein forming the second sacrificial layer comprises forming the second sacrificial layer having a thickness in a range of approximately 50 to approximately 400 Angstroms.

18. The method of claim 11, further comprising:
   forming source/drain regions in the substrate adjacent and underlying at least a portion of the gate dielectric prior to removing the first sacrificial layer and prior to removing the second sacrificial layer.

* * * * *